(12) United States Patent
Chiang et al.

(10) Patent No.: US 10,714,607 B1
(45) Date of Patent: Jul. 14, 2020

(54) HIGH ELECTRON MOBILITY TRANSISTOR

(71) Applicant: UNITED MICROELECTRONICS CORP., Hsin-Chu (TW)

(72) Inventors: Huai-Tzu Chiang, Tainan (TW);
Sheng-Hao Lin, Hsinchu County (TW);
Kuan-Hung Liu, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/294,893

(22) Filed: Mar. 6, 2019

(30) Foreign Application Priority Data

Feb. 1, 2019 (CN) .......................... 2019 1 0103281

(51) Int. Cl.
*H01L 31/0256* (2006.01)
*H01L 29/778* (2006.01)
*H01L 29/207* (2006.01)

(52) U.S. Cl.
CPC ........ *H01L 29/7786* (2013.01); *H01L 29/207* (2013.01)

(58) Field of Classification Search
CPC ............. H01L 29/1008; H01L 29/0808; H01L 29/0821; H01L 29/6625; H01L 29/735; H01L 29/737

USPC .......................................................... 257/76
See application file for complete search history.

(56) References Cited

U.S. PATENT DOCUMENTS 8,384,089 B2 2/2013 Sato
2019/0280111 A1* 9/2019 Shimizu ............. H01L 29/4236

FOREIGN PATENT DOCUMENTS

| CN | 102299071 A | * | 12/2011 |
| CN | 102299071 A | | 12/2011 |
| CN | 103904111 B | * | 1/2017 |
| CN | 103904111 B | | 1/2017 |

* cited by examiner

*Primary Examiner* — David S Blum
(74) *Attorney, Agent, or Firm* — Winston Hsu

(57) ABSTRACT

According to an embodiment of the present invention, a high electron mobility transistor (HEMT) includes: a buffer layer on a substrate; a carrier transit layer on the buffer layer; a carrier supply layer on the carrier transit layer; a gate electrode on the carrier supply layer; and a source and a drain adjacent to two sides of the gate electrode. Preferably, the carrier supply layer comprises a concentration gradient of aluminum (Al).

18 Claims, 1 Drawing Sheet

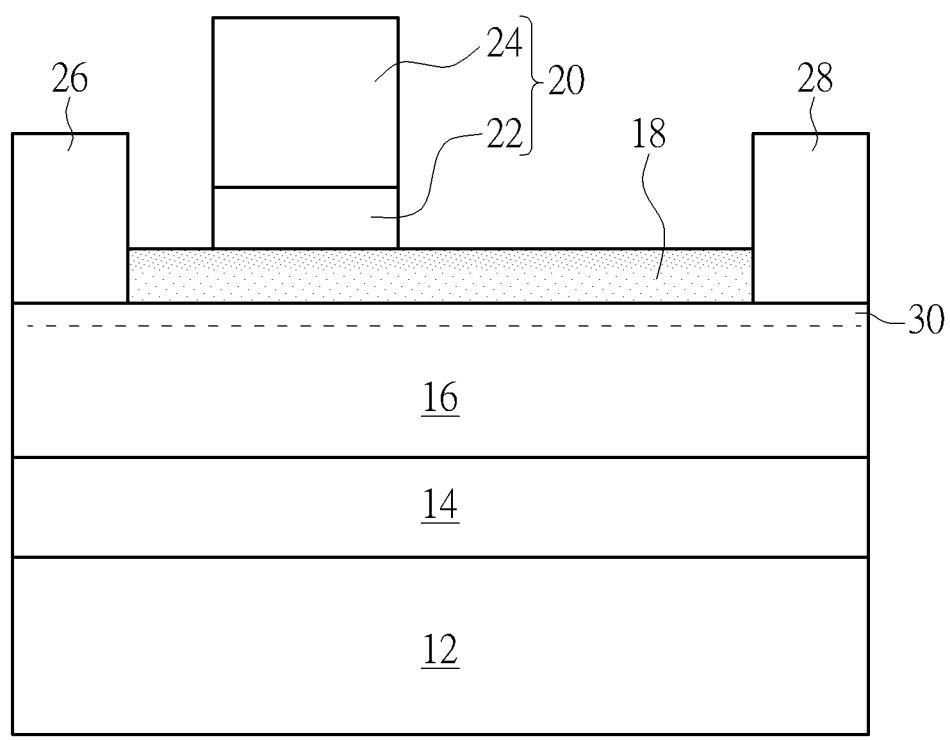

HIGH ELECTRON MOBILITY TRANSISTOR

BACKGROUND OF THE INVENTION

1. Field of the Invention

The invention relates to a high electron mobility transistor (HEMT).

2. Description of the Prior Art

High electron mobility transistor (HEMT) fabricated from GaN-based materials have various advantages in electrical, mechanical, and chemical aspects of the field. For instance, advantages including wide band gap, high break down voltage, high electron mobility, high elastic modulus, high piezoelectric and piezoresistive coefficients, and chemical inertness. All of these advantages allow GaN-based materials to be used in numerous applications including high intensity light emitting diodes (LEDs), power switching devices, regulators, battery protectors, display panel drivers, and communication devices.

SUMMARY OF THE INVENTION

According to an embodiment of the present invention, a high electron mobility transistor (HEMT) includes: a buffer layer on a substrate; a carrier transit layer on the buffer layer; a carrier supply layer on the carrier transit layer; a gate electrode on the carrier supply layer; and a source and a drain adjacent to two sides of the gate electrode. Preferably, the carrier supply layer comprises a concentration gradient of aluminum (Al).

According to another aspect of the present invention, a high electron mobility transistor (HEMT) includes: a buffer layer on a substrate; a carrier transit layer on the buffer layer; a carrier supply layer on the carrier transit layer; a gate electrode on the carrier supply layer; and a source electrode and a drain electrode adjacent to two sides of the gate electrode. Preferably, the gate electrode includes a top portion and a bottom portion and the top portion and the bottom portion include different materials.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The FIGURE illustrates a structural view of a HEMT according to an embodiment of the present invention.

DETAILED DESCRIPTION

Referring to the FIGURE, the FIGURE illustrates a structural view of a HEMT according to an embodiment of the present invention. As shown in the FIGURE, a substrate 12 such as a substrate made from silicon, silicon carbide, or aluminum oxide (or also referred to as sapphire) is provided, in which the substrate 12 could be a single-layered substrate, a multi-layered substrate, gradient substrate, or combination thereof. According to other embodiment of the present invention, the substrate 12 could also include a silicon-on-insulator (SOI) substrate.

Next, a buffer layer 14 is formed on the substrate 12. According to an embodiment of the present invention, the buffer layer 14 is preferably made of III-V semiconductors such as gallium nitride (GaN), in which a thickness of the buffer layer 14 could be between 0.5 microns to 10 microns. According to an embodiment of the present invention, the formation of the buffer layer 14 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a carrier transit layer 16 is formed on the surface of the buffer layer 14. In this embodiment, the carrier transit layer 16 is preferably made of III-V semiconductors including but not limited to for example GaN or more specifically unintentionally doped (UID) GaN. According to an embodiment of the present invention, the formation of the carrier transit layer 16 on the buffer layer 14 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a carrier supply layer 18 is formed on the surface of the carrier transit layer 16. In this embodiment, the carrier supply layer 18 is preferably made of III-V semiconductor such as n-type or n-graded aluminum gallium nitride ($Al_xGa_{1-x}N$), in which $0<x<1$, the carrier supply layer 18 preferably includes an epitaxial layer formed through epitaxial growth process, and the carrier supply layer 18 preferably includes dopants such as silicon or germanium. Similar to the buffer layer 14 and the carrier transit layer 16, the formation of the carrier supply layer 18 on the carrier transit layer 16 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

It should be noted that the carrier supply layer 18 in this embodiment preferably includes a concentration gradient of aluminum (Al). In other words, the concentration of aluminum in the carrier supply layer 18 has a gradient distribution instead of an even distribution. Specifically, the concentration of aluminum atoms in the carrier supply layer 18 preferably decreases toward the boundary between the carrier transit layer 16 and the carrier supply layer 18, or if viewed from an overall perspective, the portion of carrier supply layer 18 farther away from the boundary between the carrier transit layer 16 and the carrier supply layer 18 preferably has higher aluminum concentration (hence the more concentrated dots distribution shown in the FIGURE) whereas the portion of carrier supply layer 18 closer to the boundary between the carrier transit layer 16 and the carrier supply layer 18 has lower aluminum concentration (hence the more scarce dots distribution shown in the FIGURE).

Next, a semiconductor layer and a gate material layer are sequentially formed on the surface of the carrier supply layer 18, and a photo-etching process is conducted to remove part of the semiconductor layer and part of the gate material layer to form a gate electrode 20 on the surface of the carrier supply layer 18. Preferably the gate electrode 20 includes a bottom portion 22 and a top portion 24 after the patterning process, in which the bottom portion 22 and the top portion 24 are preferably made of different materials, a thickness of the bottom portion 22 is preferably less than a thickness of the top portion 24, and sidewalls of the top portion 24 are aligned with sidewalls of the bottom portion 22. In this embodiment, the semiconductor layer or the bottom portion 22 of the gate electrode 20 preferably includes p-type or p-aluminum gallium nitride ($Al_yGa_{1-y}N$), in which $0<y<1$ and y is preferably less than the x from ($Al_xGa_{1-x}N$) of the aforementioned carrier supply layer 18, y is preferably between 0-0.2 while x is greater than 0.2, and the bottom portion 22 could further include dopants such as magnesium (Mg), zinc (Zn), or combination thereof. The top portion 24 of the gate electrode 20 on the other hand preferably includes metal including but not limited to for example gold (Au), silver (Ag), platinum (Pt), a combination thereof, or other Schottky metals. It should be noted that even though the bottom portion 22 of the gate electrode 20 and the carrier supply layer 18 are both made of AlGaN, in contrast to aluminum atoms are distributed unevenly or having gradient distribution in the carrier supply layer 18, the bottom portion 22 of the gate electrode 20 does not have any concentration gradient of aluminum or aluminum atoms are preferably evenly distributed throughout the bottom portion 22.

Next, a source electrode 26 and a drain electrode 28 are formed adjacent to two sides of the gate electrode 20. In this embodiment, the source electrode 26 and the drain electrode are preferably made of metal. Nevertheless, in contrast to the top portion 24 of the gate electrode 20 made of Schottky metal, the source electrode 26 and the drain electrode 28 are preferably made of ohmic contact metals. According to an embodiment of the present invention, each of the source electrode 26 and drain electrode 28 could include titanium (Ti), aluminum (Al), tungsten (W), palladium (Pd), or combination thereof. Moreover, it would be desirable to first conduct a photo-etching process to remove part of the carrier supply layer 18 adjacent to two sides of the gate electrode 20 for forming a recess, conduct an electroplating process, sputtering process, resistance heating evaporation process, electron beam evaporation process, physical vapor deposition (PVD) process, chemical vapor deposition (CVD) process, or combination thereof to form electrode materials in the recess, and then pattern the electrode materials through etching process to form the source electrode 26 and the drain electrode 28. Since the source electrode 26 and the drain electrode 28 are formed adjacent to two sides of the carrier supply layer 18 through photo-etching process, the bottom surface of the carrier supply layer 18 is even with the bottom surfaces of the source electrode 26 and drain electrode 28.

Typically a heterojunction is formed at the interface between the carrier transit layer 16 and carrier supply layer 18 as a result of the bandgap difference between the two layers 16, 18. Essentially a quantum well is formed in the banding portion of the conduction band of the heterojunction to constrain the electrons generated by piezoelectricity so that two-dimensional electron gas (2DEG) is formed at the junction between the carrier transit layer 16 and carrier supply layer 18 to form conductive current. As shown in the FIGURE, a channel region 30 is preferably formed close to the junction between the carrier transit layer 16 and carrier supply layer 18 and this channel region 30 is the region where conductive current is formed by the 2DEG and in such condition the HEMT device is typically operated under a "normally on" mode.

As current gate electrodes typically made of metal gradually imports material such as p-type GaN to serve as bottom portion for the gate electrode, the operation of HEMT devices under this circumstance now shifts from "normally on" to "normally off". Nevertheless, this shift in operation further induces issues such as dynamic $R_{on}$ ratio reduction and lattice mismatch, in which lattice mismatch could also affect the formation of the aforementioned 2DEG.

In order to resolve the above issues, the present invention first replaces the carrier supply layer 18 which had even distribution of aluminum concentration with a carrier supply layer 18 having concentration gradient of aluminum, in which the portion of carrier supply layer 18 closer to the boundary between the carrier supply layer 18 and bottom portion 22 of gate electrode 20 preferably has higher concentration of aluminum atoms while the portion of carrier supply layer 18 closer to the boundary between the carrier transit layer 16 and carrier supply layer 18 preferably has lower concentration of aluminum atoms. By adjusting the concentration gradient of aluminum it would be desirable to improve the dynamic $R_{on}$ ratio reduction issue when the HEMT device is operated under the normally off mode.

Moreover, another embodiment of the present invention preferably replaces the bottom portion 22 of the gate electrode 20 from p-type GaN to p-type ($Al_yGa_{1-y}N$), in which 0<y<1 and y is preferably less than the x from ($Al_xGa_{1-x}N$) of the aforementioned carrier supply layer 18, y is preferably between 0-0.2 while x is greater than 0.2, and the bottom portion 22 could further include dopants such as magnesium (Mg), zinc (Zn), or combination thereof. By implementing a new material for the bottom portion 22 of the gate electrode 20, the present invention is able to improve the issue of lattice mismatch in current HEMT devices.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high electron mobility transistor (HEMT), comprising:
    a buffer layer on a substrate;
    a carrier transit layer on the buffer layer;
    a carrier supply layer on the carrier transit layer, wherein the carrier supply layer comprises a concentration gradient of aluminum (Al) and a concentration of Al decreases toward a boundary between the carrier transit layer and the carrier supply layer;
    a gate electrode on the carrier supply layer; and
    a source electrode and a drain electrode adjacent to two sides of the gate electrode.

2. The HEMT of claim 1, wherein the buffer layer comprises gallium nitride (GaN).

3. The HEMT of claim 1, wherein the carrier transit layer comprises unintentionally doped (UID) GaN.

4. The HEMT of claim 1, wherein the carrier supply layer comprises n-type $Al_xGa_{1-x}N$.

5. The HEMT of claim 1, wherein the carrier supply layer is doped with silicon or germanium.

6. The HEMT of claim 1, wherein carrier supply layer comprises an epitaxial layer.

7. The HEMT of claim 1, wherein bottom surfaces of the carrier supply layer and the source electrode and the drain electrode are coplanar.

8. A high electron mobility transistor (HEMT), comprising:
    a buffer layer on a substrate;
    a carrier transit layer on the buffer layer;
    a carrier supply layer on the carrier transit layer;
    a gate electrode on the carrier supply layer, wherein the gate electrode comprises a top portion and a bottom portion, the top portion and the bottom portion comprise different materials, and the top portion comprises metal and the bottom portion comprises an epitaxial layer; and
    a source electrode and a drain electrode adjacent to two sides of the gate electrode.

9. The HEMT of claim 8, wherein the buffer layer comprises gallium nitride (GaN).

10. The HEMT of claim 8, wherein the carrier transit layer comprises unintentionally doped (UID) GaN.

11. The HEMT of claim 8, wherein the carrier supply layer comprises n-type $Al_xGa_{1-x}N$.

12. The HEMT of claim 8, wherein the carrier supply layer is doped with silicon or germanium.

13. The HEMT of claim 8, wherein the carrier supply layer comprises an epitaxial layer.

14. The HEMT of claim 8, wherein the bottom portion comprises p-type $Al_yGa_{1-y}N$.

15. The HEMT of claim 8, wherein the bottom portion is doped with Mg or Zn.

16. The HEMT of claim 8, wherein a thickness of the bottom portion is less than a thickness of the top portion.

17. The HEMT of claim 8, wherein a sidewall of the top portion is aligned with a sidewall of the bottom portion.

18. The HEMT of claim 8, wherein bottom surfaces of the carrier supply layer and the source electrode and the drain electrode are coplanar.

\* \* \* \* \*